US011067857B2

(12) United States Patent
Takeuchi et al.

(10) Patent No.: US 11,067,857 B2
(45) Date of Patent: Jul. 20, 2021

(54) DISPLAY PANEL, DISPLAY DEVICE, AND METHOD FOR MANUFACTURING DISPLAY PANEL

(71) Applicant: SAKAI DISPLAY PRODUCTS CORPORATION, Sakai (JP)

(72) Inventors: Kenta Takeuchi, Sakai (JP); Chikanori Tsukamura, Sakai (JP); Naoki Kotani, Sakai (JP); Kenichi Mukai, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

(21) Appl. No.: 16/330,463

(22) PCT Filed: Sep. 5, 2016

(86) PCT No.: PCT/JP2016/076021
§ 371 (c)(1),
(2) Date: Apr. 30, 2019

(87) PCT Pub. No.: WO2018/042664
PCT Pub. Date: Mar. 8, 2018

(65) Prior Publication Data
US 2019/0310504 A1 Oct. 10, 2019

(51) Int. Cl.
*G02F 1/1339* (2006.01)
*G02F 1/1343* (2006.01)
(Continued)

(52) U.S. Cl.
CPC ........ *G02F 1/13394* (2013.01); *G02F 1/1343* (2013.01); *G02F 1/133514* (2013.01);
(Continued)

(58) Field of Classification Search
None
See application file for complete search history.

(56) References Cited

U.S. PATENT DOCUMENTS 4,470,667 A * 9/1984 Okubo .................. G02F 1/1335
349/106
5,748,266 A * 5/1998 Kodate ............. G02F 1/136213
349/39
(Continued)

FOREIGN PATENT DOCUMENTS

CN 1550827 A 12/2004
CN 103676337 A 3/2014
(Continued)

*Primary Examiner* — Edward J Glick
*Assistant Examiner* — Anthony G Quash
(74) *Attorney, Agent, or Firm* — ScienBiziP, P.C.

(57) ABSTRACT

Provided are: a display panel whereby a frame can be narrowed, while ensuring conduction between substrates; a display device; and a method for manufacturing the display panel. The display panel is provided with: a first substrate having a surface, on which an electrode layer is formed; a second substrate having a surface, on which a wiring path for supplying the electrode layer with signals is formed; and a sealing section that defines a space sealed between the first substrate surface and the second substrate surface, which are facing each other. The display panel is also provided with a columnar section that electrically connects the electrode layer to the wiring path. The columnar section is formed at a position in contact with the sealing section.

8 Claims, 6 Drawing Sheets

(51) Int. Cl.
   *G02F 1/1335*   (2006.01)
   *G09F 9/30*      (2006.01)
   *G02B 6/42*          (2006.01)
   *G02F 1/1345*        (2006.01)
   *G02F 1/1362*        (2006.01)
   *H01L 23/60*         (2006.01)

(52) U.S. Cl.
   CPC .......... *G02F 1/134309* (2013.01); *G09F 9/30* (2013.01); *G02B 6/4275* (2013.01); *G02F 1/1339* (2013.01); *G02F 1/1345* (2013.01); *G02F 1/136204* (2013.01); *G02F 1/136218* (2021.01); *G02F 2201/121* (2013.01); *H01L 23/60* (2013.01)

(56)                References Cited

U.S. PATENT DOCUMENTS

| | | | |
|---|---|---|---|
| 5,757,451 A * | 5/1998 | Miyazaki | G02F 1/13394 349/106 |
| 6,392,735 B1 * | 5/2002 | Tani | G02F 1/1339 349/153 |
| 6,504,592 B1 | 1/2003 | Takatori et al. | |
| 6,671,025 B1 * | 12/2003 | Ikeda | G02F 1/133514 349/106 |
| 6,778,248 B1 * | 8/2004 | Ootaguro | G02F 1/13394 349/153 |
| 6,812,986 B2 | 11/2004 | Takatori et al. | |
| 7,212,270 B2 | 5/2007 | Takatori et al. | |
| 7,405,798 B2 | 7/2008 | Yoo et al. | |
| 7,612,848 B2 | 11/2009 | Takatori et al. | |
| 7,777,858 B2 | 8/2010 | Yoo et al. | |
| 8,049,848 B2 | 11/2011 | Takatori et al. | |
| 9,645,448 B2 | 5/2017 | Xie et al. | |
| 2002/0196393 A1 * | 12/2002 | Tashiro | G02F 1/1339 349/106 |
| 2003/0025865 A1 | 2/2003 | Takatori et al. | |
| 2004/0227895 A1 | 11/2004 | Yoo et al. | |
| 2005/0036096 A1 | 2/2005 | Takatori et al. | |
| 2005/0151909 A1 * | 7/2005 | Yagi | G02F 1/133514 349/138 |
| 2006/0017872 A1 * | 1/2006 | Tokuda | G02F 1/13394 349/122 |
| 2007/0058125 A1 | 3/2007 | Yoo et al. | |
| 2007/0165172 A1 | 7/2007 | Takatori et al. | |
| 2010/0066964 A1 | 3/2010 | Takatori et al. | |
| 2012/0169977 A1 * | 7/2012 | Tsubata | G02B 5/201 349/106 |
| 2013/0164870 A1 | 6/2013 | Shim et al. | |
| 2016/0011444 A1 | 1/2016 | Xie et al. | |
| 2016/0035803 A1 * | 2/2016 | Kim | H01L 27/326 257/40 |

FOREIGN PATENT DOCUMENTS

| | | | | |
|---|---|---|---|---|
| JP | H08-262484 A | | 10/1996 | |
| JP | 2000-356775 A | | 12/2000 | |
| JP | 2001005017 A | | 1/2001 | |
| JP | 2001-100217 A | | 4/2001 | |
| JP | 2001005017 A | * | 10/2001 | .......... G02F 1/1335 |
| JP | 2005-321455 A | | 11/2005 | |
| JP | 2006194920 A | * | 7/2006 | .......... G02F 1/1339 |
| JP | 2008250324 A | * | 10/2008 | .......... G02F 1/1368 |
| JP | 2011-221313 A | | 11/2011 | |

* cited by examiner

DISPLAY PANEL, DISPLAY DEVICE, AND METHOD FOR MANUFACTURING DISPLAY PANEL

TECHNICAL FIELD

The present invention relates to a display panel for displaying images, a display apparatus, and a method for producing the display panel.

BACKGROUND ART

A display apparatus with the use of a liquid crystal includes a display panel having a structure including two opposing substrates and the liquid crystal held between the substrates. The display panel has a sealing section located between the two substrates and defining a sealed space between the substrates. The space between the substrates is filled with the liquid crystal. The sealing section is bound to opposing surfaces of the two respective substrates. Each of the two substrates is provided with a circuit, requiring conduction between the substrates. In the conventional display panel, the sealing section contains conductive beads, and the substrates are each provided with a conduction electrode for conduction therebetween. The sealing section is located in contact with these electrodes. The conductive beads in the sealing section are in contact with the conduction electrodes, thereby enabling conduction between the substrates.

However, the substrates may have electrodes that are not meant for conduction between the substrates but are located in contact with the sealing section. For example, in a display panel having a gate on array (GOA) structure in which a gate driver is formed on an array substrate, a contact section of the gate driver is exposed on the substrate. If conduction between substrates is enabled through conductive beads in a sealing section of such a display panel, undesired conduction is caused between the substrates to disturb normal operation of the display panel. The display panel therefore needs a method for enabling conduction between the substrates without the use of conductive beads in the sealing section. Patent Literature 1 discloses a display panel that includes a conduction component for enabling conduction between substrates independently from a sealing section.

CITATION LIST

Patent Literature

[Patent Literature 1]
Japanese Patent Application Laid-Open Publication No. 2011-221313

SUMMARY OF INVENTION

Technical Problem

In the display panel disclosed in Patent Literature 1, the conduction component is disposed outside of the sealing section. Such an arrangement requires a space for the conduction component outside of the sealing section, preventing a resulting display apparatus from having narrower borders.

The present invention has been made in view of the circumstances described above, and an object thereof is to provide a display panel that allows a resulting display apparatus to have narrower borders while ensuring conduction between substrates, a display apparatus, and a method for producing the display panel.

Solution to Problem

A display panel according to an embodiment of the present disclosure includes a first substrate, a second substrate, a sealing section, and a plurality of pillar sections. The first substrate has a surface provided with an electrode layer. The second substrate has a surface provided with line routing for applying signals to the electrode layer. The surface of the second substrate faces the surface of the first substrate. The sealing section defines a sealed space between the opposing surfaces of the first and second substrates. The pillar sections enable electrical connection between the electrode layer and the line routing. The pillar sections are located in contact with the sealing section.

A display panel production method according to an embodiment of the present disclosure is a method for producing a display panel including a first substrate, a second substrate, a sealing section, and a plurality of pillar sections. The first substrate has a surface provided with an electrode layer. The second substrate has a surface provided with line routing for applying signals to the electrode layer. The surface of the second substrate faces the surface of the first substrate. The sealing section defines a sealed space between the opposing surfaces of the first and second substrates. The pillar sections enable electrical connection between the electrode layer and the line routing. The method includes: forming the pillar sections on the surface of the first substrate and then forming the sealing section on the surface of the first substrate at a position where the sealing section is not in contact with the pillar sections; causing the surface of the first substrate and the surface of the second substrate to face each other; and bonding the first substrate and the second substrate together through the sealing section to electrically connect the pillar sections to the line routing on the second substrate. The position at which the sealing section is formed allows the sealing section spreading due to the first and second substrates being bonded together through the sealing section to be in contact with the pillar sections.

Advantageous Effects of Invention

According to the embodiment of the present invention, it is not necessary to secure a space for a conduction component outside of the sealing section. It is therefore possible to reduce the space outside of the sealing section of the display panel thereby to allow a resulting display apparatus to have narrower borders.

DESCRIPTION OF EMBODIMENTS

The following describes the present invention in detail based on the accompanying drawings illustrating an embodiment of the present invention.

Figure 1:
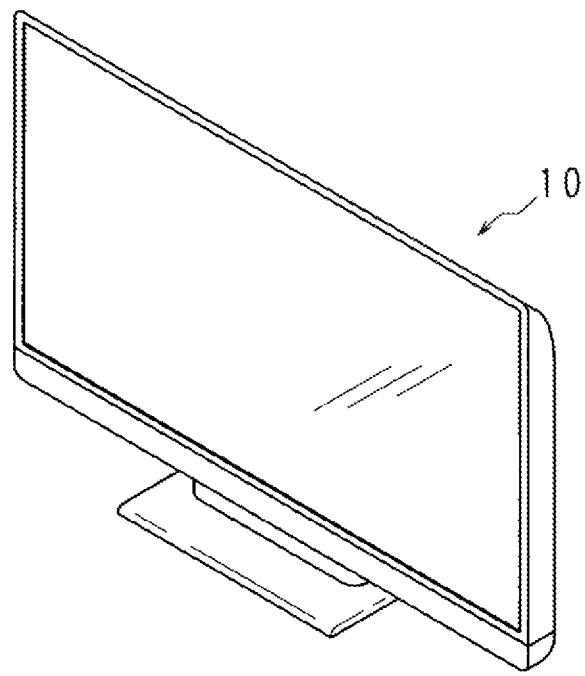
FIG. 1 is a perspective view schematically illustrating external appearance of a display apparatus.
Figure 2:
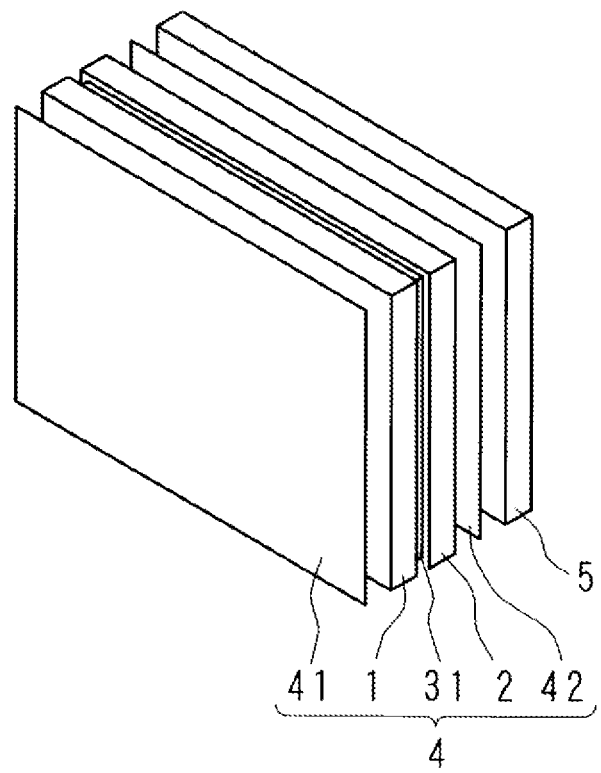
FIG. 2 is an exploded perspective view schematically illustrating a configuration of optical elements of the display apparatus.

FIG. 1 is a perspective view schematically illustrating external appearance of a display apparatus 10. The display apparatus 10 is for example a television receiver. FIG. 2 is an exploded perspective view schematically illustrating a configuration of optical elements of the display apparatus 10. The display apparatus 10 includes a display panel 4 and a backlight 5 located rearward of the display panel 4. In the present specification, the direction-wise term "front" means a direction toward a user viewing the display apparatus, and the direction-wise term "back" means an opposite direction. The display panel 4 is a liquid-crystal panel. The display apparatus 10 is a liquid-crystal display apparatus for displaying images (including pictures) using the liquid-crystal panel. The display panel 4 displays an image by being illuminated by the backlight 5 from behind. That is, illumination light from the backlight 5 travels from back to front of the display panel 4. The display panel 4 includes a polarizing plate 41 and a polarizing plate 42 that each transmit linearly polarized light. A polarization direction of the light in the polarizing plate 41 and a polarization direction of the light in the polarizing plate 42 are perpendicular to each other. A first substrate (a color filter (CF) substrate) 1 and a second substrate (a thin film transistor (UT) substrate) 2 are disposed between the polarizing plate 41 and the polarizing plate 42. Color filters are formed on a surface of the first substrate 1. An active matrix circuit is formed on a surface of the second substrate 2. The display panel 4 also includes a sealing section 31 that defines a sealed space between the first substrate 1 and the second substrate 2. Note that the display apparatus 10 may further include other optical elements.

Figure 3:
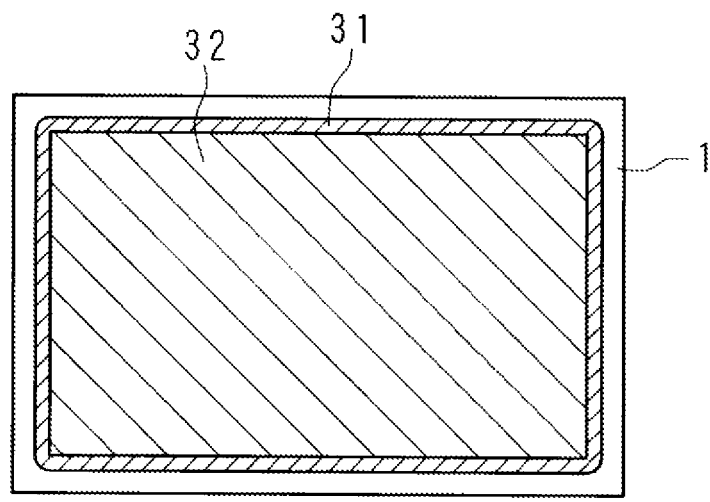
FIG. 3 is a cross-sectional view of a first substrate and a sealing section, taken along a direction orthogonal to a front-back direction.

FIG. 3 is a cross-sectional view of the first substrate 1 and the sealing section 31, taken along a direction orthogonal to a front-back direction. The sealing section 31 is an insulating member and has a closed curve shape in a front plan view of the surface of the first substrate 1. The sealing section 31 has a closed curve shape also in a front plan view of the surface of the second substrate 2. As such, the sealing section 31 is disposed between the opposing first and second substrates 1 and 2, and defines a sealed space between the first and second substrates 1 and 2. That is, the sealed space between the first and second substrates 1 and 2 is surrounded by the sealing section 31 in a front plan view of the surface of the first substrate 1 or the surface of the second substrate 2. The sealed space is filled with a liquid crystal 32. That is, the liquid crystal 32 is located inside of the sealing section 31 between the first substrate 1 and the second substrate 2.

Figure 4:
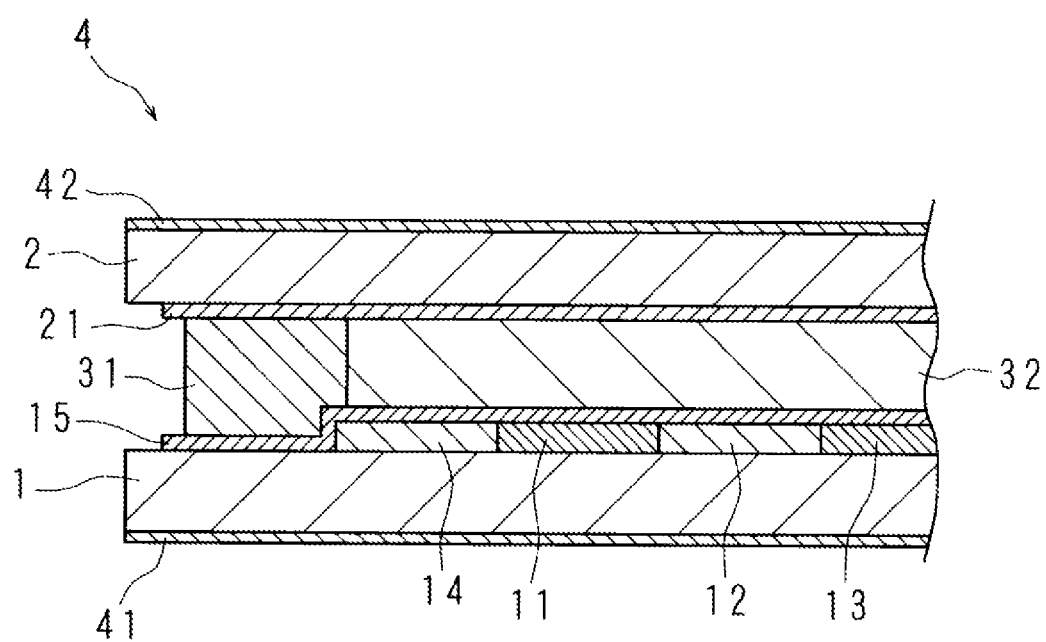
FIG. 4 is a partial cross-sectional view schematically illustrating a portion of a cross-section of a display panel, taken along the front-back direction.

FIG. 4 is a partial cross-sectional view schematically illustrating a portion of a cross-section of the display panel 4, taken along the front-back direction. The first substrate 1 and the second substrate 2 are disposed such that the surface of the first substrate 1 and the surface of the second substrate 2 face each other with a distance therebetween. A plurality of coloring films are formed on the surface of the first substrate 1 that faces the second substrate 2. The coloring films are color filters. The coloring films include first coloring films 11, second coloring films 12, and third coloring films 13 that transmit light of different colors. For example, the first coloring films 11 transmit red light, the second coloring films 12 transmit green light, and the third coloring films 13 transmit blue light. Black matrix films 14 that block light are also formed on the surface of the first substrate 1. The first coloring films 11, the second coloring films 12, the third coloring films 13, and the black matrix films 14 are disposed along the surface of the first substrate 1. For example, a plurality of sets each including a first coloring film 11, a second coloring film 12, and a third coloring film 13 are arranged in a matrix on the first substrate 1, and the black matrix films 14 are disposed between the sets of the coloring films. Furthermore, a conductive electrode layer 15 is formed on the surface of the first substrate 1. The electrode layer 15 is disposed over the first coloring films 11, the second coloring films 12, the third coloring films 13, and the black matrix films 14. The first substrate 1 and the electrode layer 15 are transparent. The first substrate 1, the first coloring films 11, the second coloring films 12, the third coloring films 13, and the black matrix films 14 are formed using an insulating photoresist.

A conductive circuit layer 21 is formed on the surface of the second substrate 2 that faces the first substrate 1. The circuit layer 21 includes lines, such as gate lines and data lines, and a plurality of switching elements. A portion of the circuit layer 21 forms the active matrix circuit. The second substrate 2 and the circuit layer 21 are transparent. The second substrate 2 is an insulating substrate. The sealing section 31 is bound to the surface of the first substrate 1 and the surface of the second substrate 2. The space defined by the sealing section 31 between the first substrate 1 and the second substrate 2 is filled with the liquid crystal 32. The sealing section 31 contains insulating beads for securing a distance between the first substrate 1 and the second substrate 2. The insulating beads are not illustrated. The sealing section 31 is in contact with a portion of the electrode layer 15 and a portion of the circuit layer 21. The second substrate 2 and the circuit layer 21 are transparent. The electrode layer 15 and the circuit layer 21 are electrically connected to each other, which is not shown in FIG. 4. The circuit layer 21 provides line routing for applying signals to the electrode layer 15. The active matrix circuit in the circuit layer 21 and the electrode layer 15 receiving signals from the circuit layer 21 operate to selectively turn on the switching elements in the active matrix circuit. Orientation of some of liquid crystal molecules of the liquid crystal 32 changes at locations corresponding to the turned-on switching elements to allow light from the backlight 5 to pass through the locations of the display panel 4, thereby displaying an image.

Figure 5:
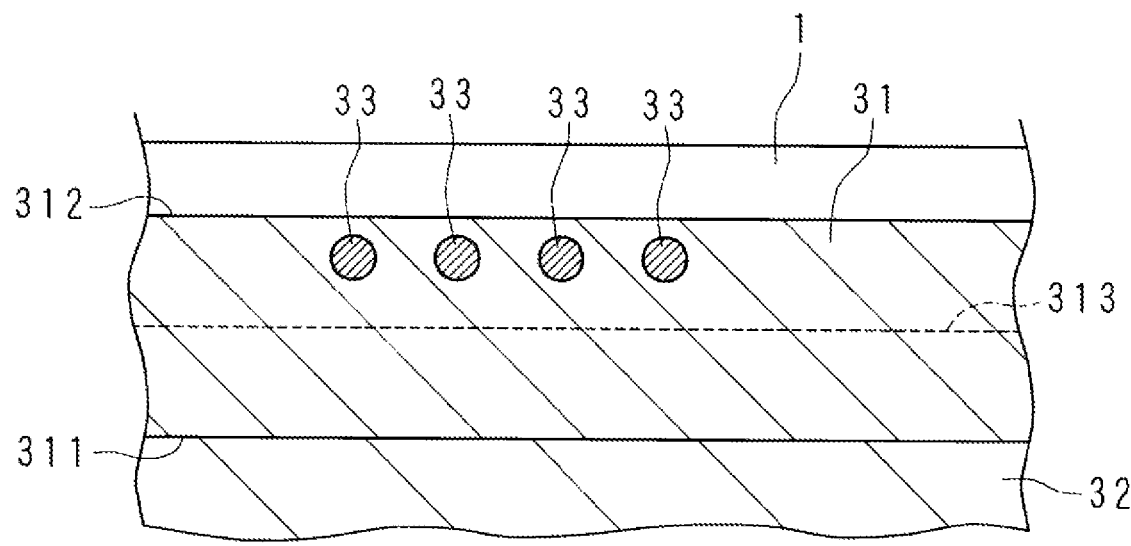
FIG. 5 is a partial cross-sectional view schematically illustrating a portion of a cross-section of the display panel, taken along the direction orthogonal to the front-back direction.

The following describes a configuration for electrically connecting the electrode layer 15 and the circuit layer 21 to each other. FIG. 5 is a partial cross-sectional view schematically illustrating a portion of a cross-section of the display panel 4, taken along the direction orthogonal to the front-back direction. FIG. 5 shows a portion of a cross-section of the sealing section 31, taken along the direction orthogonal to the front-back direction. The sealing section 31 has a closed curve shape in the cross-section taken along the direction orthogonal to the front-back direction and has some width in a direction intersecting with a circumferential direction of the closed curve (an inward-outward direction of the closed curve). That is, the sealing section 31 has an inner edge and an outer edge. In the present specification, a region where the sealing section 31 and the first substrate 1 are in contact with each other is referred to as a contact region of the surface of the first substrate 1 with the sealing section 31. A width of the contact region is defined by an inner edge 311 and an outer edge 312 of the sealing section 31. The width of the sealing section 31 (a distance from the inner edge 311 to the outer edge 312 along the inward-outward direction of the closed curve) is for example 1,700 μm. The inner edge 311 is closer to a center of the first substrate 1 than the outer edge 312. In the cross-section taken along the direction orthogonal to the front-back direction, a space between the inner edge 311 and the center of the first substrate 1 (inside of the sealing section 31) is filled with the liquid crystal 32. A plurality of pillar sections 33 extending from the first substrate 1 are provided in the sealing section 31. The pillar sections 33 are located between the inner edge 311 and the outer edge 312 of the contact region of the surface of the first substrate 1 with the sealing section 31. That is, the pillar sections 33 are located in contact with the sealing section 31 between the first substrate 1 and the second substrate 2 bonded to each other through the sealing section 31. The pillar sections 33 are not in contact with a specific middle line 313 between the inner edge 311 and the outer edge 312 of the sealing section 31. The specific middle line 313 is for example a central line that is equidistant from the inner edge 311 and the outer edge 312 and that is defined by midpoints between the inner edge 311 and the outer edge 312. The pillar sections 33 enable electrical connection between the electrode layer 15 and the circuit layer 21. Although FIG. 5 shows four pillar sections 33, the number of pillar sections 33 is not limited to four. The inner edge 311 of the contact region defines an outer edge of the space (the sealed space between the first substrate 1 and the second substrate 2) on the surface of the first substrate 1. The middle line 313 is a reference line for formation of the sealing section 31 on the surface of the first substrate 1.

Figure 6:
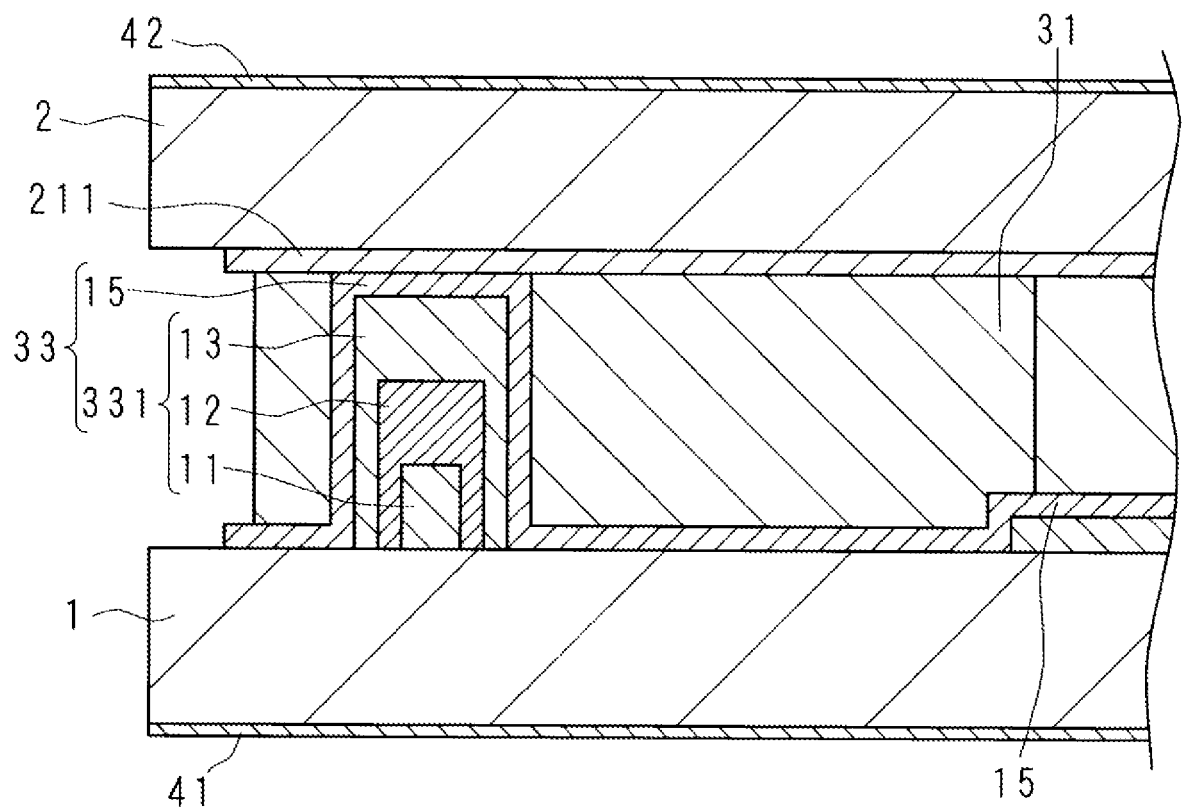
FIG. 6 is a partial cross-sectional view schematically illustrating a portion including a pillar section of the cross-section of the display panel, taken along the front-back direction.

FIG. 6 is a partial cross-sectional view schematically illustrating a portion of the cross-section of the display panel 4, taken along the front-back direction. The portion illustrated in FIG. 6 includes a pillar section 33. The pillar sections 33 are formed on the surface of the first substrate 1 as protrusions protruding from the surface of the first substrate 1. A connection pad 211 for electrical connection with the electrode layer 15 is provided on the surface of the second substrate 2 that faces the first substrate 1. The connection pad 211 is included in the circuit layer 21. Preferably, the circuit layer 21 includes a plurality of connection pads 211. Ends (distal ends based on the first substrate 1) of the pillar sections 33 are in contact with the connection pads 211. Each of the pillar sections 33 includes a base 331 and the electrode layer 15 covering the base 331. The base 331 includes a first coloring film 11, a second coloring film 12, and a third coloring film 13 that are stacked on one another. The bases 331 are in contact with the electrode layer 15 through the electrode layer 15 covering the bases 331. The electrode layer 15 covering the bases 331 are in contact with the connection pads 211. The pillar sections 33 are connected to the circuit layer 21 through the electrode layer 15 being in contact with the connection pads 211. As described above, the pillar sections 33 enable electrical connection between the electrode layer 15 and the circuit layer 21, so that signals can be applied from the circuit layer 21 to the electrode layer 15. Since the bases 331 are each formed by stacking a first coloring film 11, a second coloring film 12, and a third coloring film 13, the pillar sections 33 can be in contact with the connection pad 211. In each base 331, the first coloring film 11, the second coloring film 12, and the third coloring 13 are stacked in the stated order with the first coloring film 11 being the lowest layer and with the upper coloring films entirely covering the lower coloring films.

Since the pillar sections 33 enable electrical connection between the electrode layer 15 and the circuit layer 21, it is possible to enable conduction between the electrode layer 15 and the circuit layer 21 without the need to include conductive beads in the sealing section 31. No particular limitations are placed on the pillar sections 33 so long as the pillar sections 33 are provided at locations where connection between the electrode layer 15 and the circuit layer 21 is needed. Since the sealing section 31 contains no conductive beads, the possibility of undesired conduction through the conductive beads is eliminated. As a result, there will be no undesired conduction between the electrode layer 15 and the circuit layer 21 even if the display panel 4 for example has a GOA structure in which a contact section is exposed on the surface of the first substrate 1 or the surface of the second substrate 2. Furthermore, the configuration that allows the pillar sections 33 to be located in contact with the sealing section 31 eliminates the need to secure a space for the pillar sections 33 outside of the sealing section 31. Accordingly, the display apparatus 10 having narrower borders can be achieved by reducing the space outside of the sealing section 31 in the display panel 4.

The following describes a method for producing the display panel 4. The black matrix films 14, the first coloring films 11, the second coloring films 12, and the third coloring films 13 are formed on a surface of a glass substrate using an insulating photoresist to obtain the first substrate 1. At each of locations where the pillar sections 33 are to be formed, a first coloring film 11, a second coloring film 12, and a third coloring film 13 are stacked. Through the above, the bases 331 of the pillar sections 33 are formed. Next, a conductive material is used to form the electrode layer 15 over surfaces of the coloring films. The electrode layer 15 is disposed so as to cover the bases 331 to form the pillar sections 33. The pillar sections 33 are each a stack of the coloring films and the electrode layer 15, and therefore protrude farther from the surface of the first substrate 1 than other portions. Since the pillar sections 33 are each a stack of the coloring films and the electrode layer 15, the pillar sections 33 can be formed through processes of forming the coloring films and the electrode layer 15. That is, formation of the pillar sections 33 does not require any further process in addition to the processes of forming the coloring films and the electrode layer 15. Furthermore, formation of the pillar sections 33 does not require any particular material for the pillar sections 33. It is therefore possible to prevent an increase in production cost of the display panel 4 due to formation of the pillar section 33.

Figure 7:
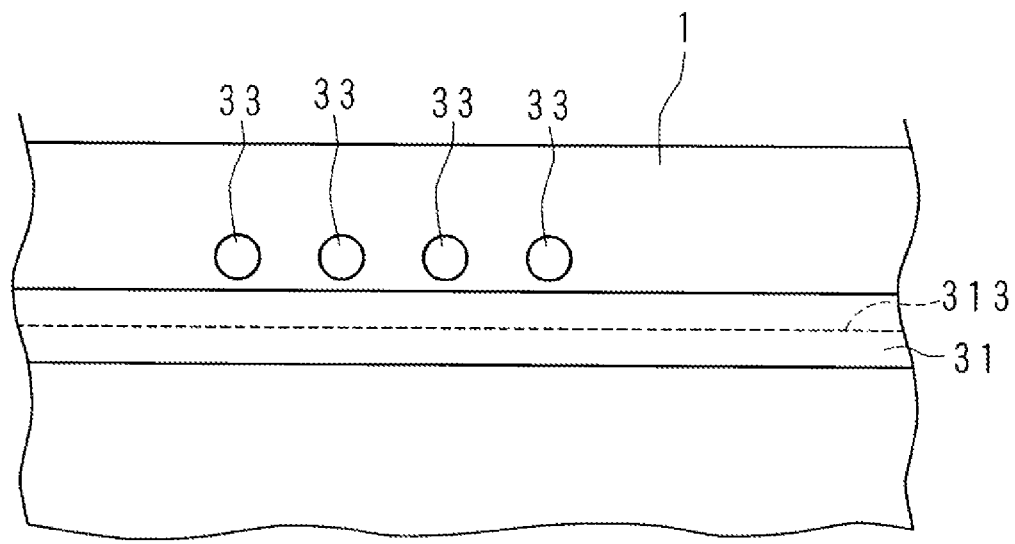
FIG. 7 is a partial plan view schematically illustrating a portion of the first substrate placed with a surface having the sealing section formed thereon facing upward in a vertical direction.
Figure 8:
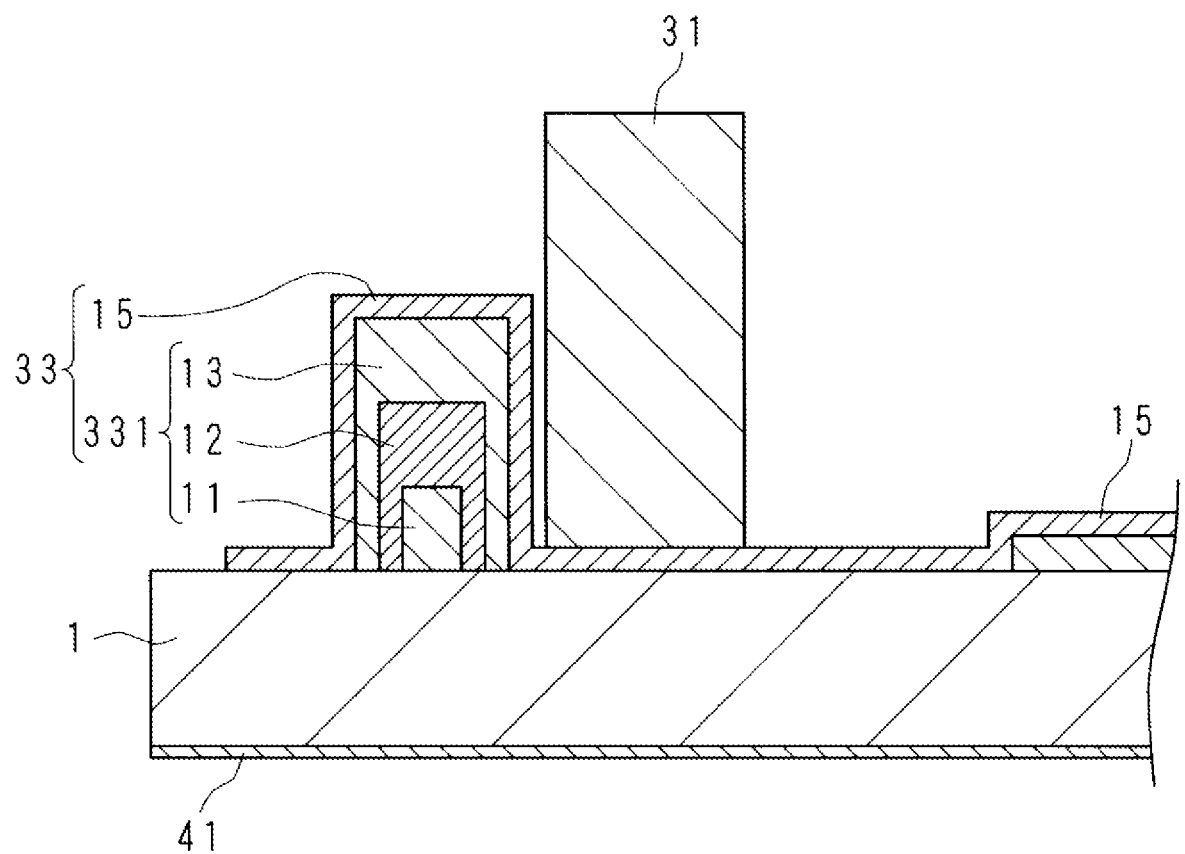
FIG. 8 is a partial cross-sectional view schematically illustrating a portion of the first substrate having the sealing section formed thereon, taken along the front-back direction.

Next, the sealing section 31 is formed on the surface of the first substrate 1. FIG. 7 is a partial plan view schematically illustrating a portion of the first substrate 1 placed with the surface having the sealing section 31 formed thereon facing upward in a vertical direction. FIG. 8 is a partial cross-sectional view schematically illustrating a portion of the first substrate 1 having the sealing section 31 formed thereon, taken along the front-back direction. In the process of forming the sealing section 31, the sealing section 31 is formed on the first substrate 1 at a position where the sealing section 31 is not in contact with the pillar sections 33. The sealing section 31 is formed from a deformable insulating material such as thermosetting resin. In the process of forming the sealing section 31, the material of the sealing section 31 is applied onto the surface of the first substrate 1 along the middle line 313 into a closed curve shape in a front plan view. As described above, the specific middle line 313 is a closed curve on the surface of the first substrate 1 and is a reference line for application of the material of the sealing section 31 onto the surface of the first substrate 1 in production. That is, the position of the middle line 313 is to allow the resulting sealing section 31 to have a maximum possible thickness in the front-back direction. As illustrated in FIGS. 7 and 8, the pillar sections 33 are not in contact with the sealing section 31 after the sealing section 31 has been formed on the surface of the first substrate 1 along the middle line 313 and before the first substrate 1 and the second substrate 2 are bonded together. In FIGS. 7 and 8 illustrating such a state, the width (a length in a left-right direction in FIG. 8) of the sealing section 31 in the inward-outward direction of the closed curve is smaller and a height (a length in an up-down direction in FIG. 8) of the sealing section 31 in the front-back direction is larger than in FIGS. 5 and 6 illustrating the display panel 4 after the first substrate 1 and the second substrate 2 have been bonded together. For example, the width of the sealing section 31 as illustrated in FIGS. 7 and 8 is 200 μm to 300 μm.

Next, the second substrate 2 is oriented such that the surface thereof having the circuit layer 21 formed thereon faces the surface of the first substrate 1. The connection pads 211 are included in the circuit layer 21 and located opposite to the pillar sections 33. Next, the second substrate 2 is moved toward the first substrate 1 to bond the first substrate 1 and the second substrate 2 together through the sealing section 31. The second substrate 2 is moved toward the first substrate 1 so that the ends of the pillar sections 33 come in contact with the connection pads 211. Thus, the pillar sections 33 are connected to the circuit layer 21, so that the electrode layer 15 is electrically connected to the circuit layer 21. As the second substrate 2 comes closer to the first substrate 1, the sealing section 31 deforms to spread along the surfaces of the first substrate 1 and the second substrate 2 to be bound to the surfaces of the first substrate 1 and the second substrate 2. Through the above, the first substrate 1 and the second substrate 2 are bonded together through the sealing section 31. After the first substrate 1 and the second substrate 2 have been bonded together through the sealing section 31, the spread sealing section 31 is in contact with the pillar sections 33 as illustrated in FIGS. 5 and 6. The position of the middle line 313, which in other words is a position at which the sealing section 31 is formed, is at such a distance from the pillar sections 33 that the sealing section 31 can be in contact with the pillar sections 33 by spreading due to the first substrate 1 and the second substrate 2 being bonded together. The positions of the pillar sections 33 allow the pillar sections 33 to be out of contact with the sealing section 31 before the first substrate 1 and the second substrate 2 are bonded together and allow the pillar sections 33 to be in contact with the sealing section 31 after the first substrate 1 and the second substrate 2 have been bonded together.

Next, the space surrounded by the sealing section 31 between the first substrate 1 and the second substrate 2 (inside of the sealing section 31) is filled with the liquid crystal 32. The sealing section 31 hardens, and thus the display panel 4 is complete. Note that an overview of the production method of the display panel 4 is described above, and the production method of the display panel 4 may include other processes.

Figure 9:
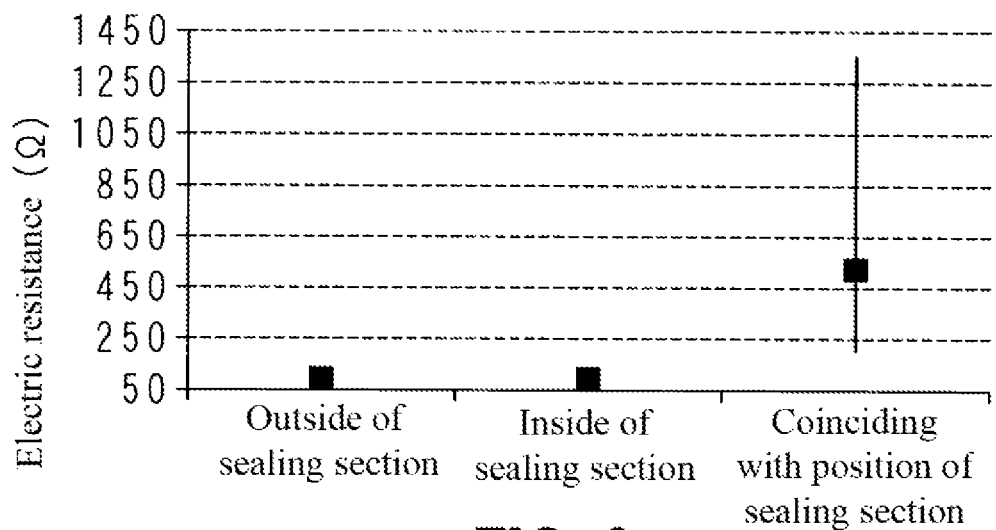
FIG. 9 is a chart illustrating a relationship between electric resistance and position of pillar sections.

FIG. 9 is a chart illustrating a relationship between electric resistance and position of the pillar sections 33. The horizontal axis of FIG. 9 represents position of the pillar sections 33. Specifically, the horizontal axis represents position of the pillar sections 33 in the following configurations: a configuration in which the pillar sections 33 are disposed in positions that coincide with the position at which the sealing section 31 is formed, which in other words are positions where the pillar sections 33 are in contact with the middle line 313; a configuration in which the pillar sections 33 are disposed in positions inside of the sealing section 31, which in other words are positions that do not coincide with the position at which the sealing section 31 is formed; and a configuration in which the pillar sections 33 are disposed in positions outside of the sealing section 31, which in other words are positions that do not coincide with the position at which the sealing section 31 is formed. The vertical axis represents electric resistance between the electrode layer 15 and the circuit layer 21 obtained through the pillar sections 33. FIG. 9 shows a result of electric resistance obtained through the pillar sections 33 in the varied positions. The configuration in which the pillar sections 33 are disposed in positions inside of the sealing section 31, which in other words are positions that do not coincide with the position at which the sealing section 31 is formed, and the configuration in which the pillar sections 33 are disposed in positions outside of the sealing section 31, which in other words are positions that do not coincide with the position at which the sealing section 31 is formed, both resulted in an electric resistance of approximately 50Ω. By contrast, the configuration in which the pillar sections 33 are disposed in positions that coincide with the position which the sealing section 31 is formed resulted in an electric resistance of as large as approximately 500Ω varying over a wide range of from less than 250Ω to greater than 1,230Ω. That is, in the configuration in which the pillar sections 33 are disposed in positions that coincide with the position at which the sealing section 31 is formed, the electric resistance obtained through the pillar sections 33 is larger and unstable.

In the configuration in which the pillar sections 33 are disposed in positions that coincide with the position at which the sealing section 31 is formed, the sealing section 31 is in contact with the pillar sections 33 before the first substrate 1 and the second substrate 2 are bonded together. The result shown in FIG. 9 indicates that the electric resistance increases and varies widely because the sealing section 31 covers the pillar sections 33 before the first substrate 1 and the second substrate 2 are bonded together and prevents the pillar sections 33 from coming in contact with the connection pads 211. It is evident that the electric resistance is smaller and stable, and connection between the electrode layer 15 and the circuit layer 21 is ensured in the configuration in which the pillar sections 33 are disposed in positions inside of the sealing section 31, which in other words are positions that do not coincide with the position at which the sealing section 31 is formed. It is therefore desirable in terms of ensuring connection between the electrode layer 15 and the circuit layer 21 that the pillar sections 33 are disposed in positions that do not coincide with the position at which the sealing section 31 is formed, which in other words are positions where the pillar sections 33 are not in contact with the middle line 313.

Figure 10:
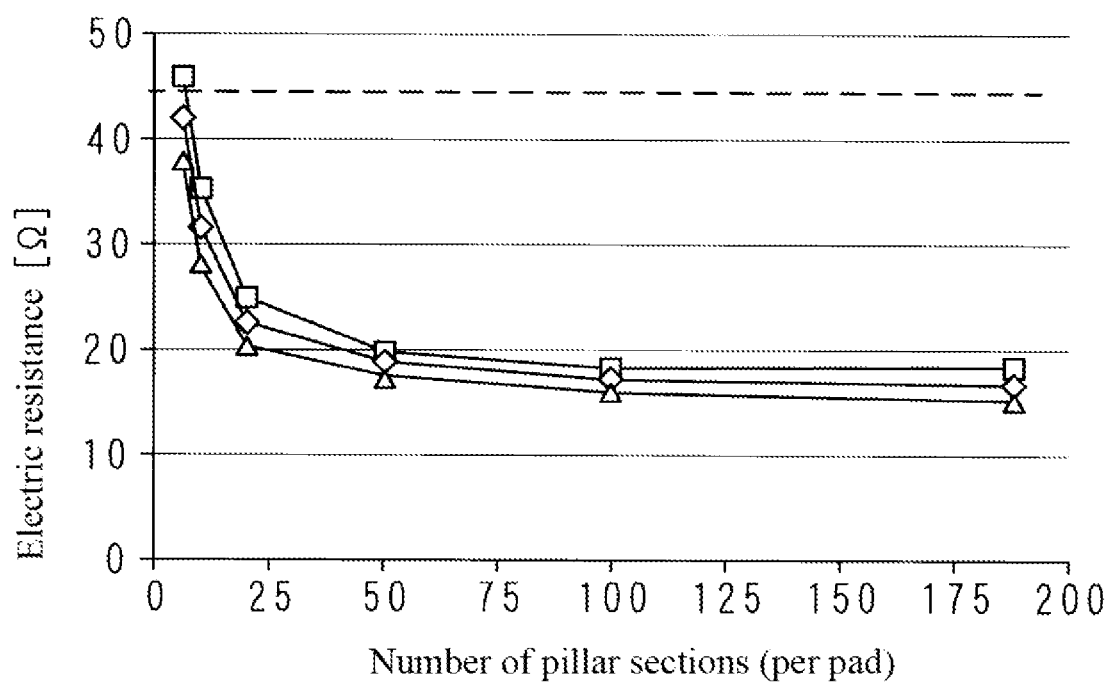
FIG. 10 is a chart illustrating a relationship between electric resistance and the number of pillar sections.

FIG. 10 is a chart illustrating a relationship between electric resistance and the number of pillar sections 33. The horizontal axis of FIG. 10 represents number of pillar sections 33 connected per connection pad 211. The vertical axis represents electric resistance between the electrode layer 15 and the circuit layer 21 obtained through the pillar sections 33. FIG. 10 shows a result of electric resistance measured by varying the number of pillar sections 33 connected per connection pad 211. Diamonds represent average values of the electric resistance, squares represent values obtained by adding standard deviation to the average values, and triangles represent values obtained by subtracting standard deviation from the average values. A horizontal dashed line represents the electric resistance in a conventional configuration in which conductive beads in a sealing section were used for conduction. The conventional electric resistance was approximately 45Ω.

As shown in FIG. 10, when the number of pillar sections 33 per connection pad 211 was 25, the electric resistance obtained through the pillar sections 33 was approximately 20Ω. This electric resistance is sufficiently smaller than the conventional electric resistance. Accordingly, the number of pillar sections 33 per connection pad 211 is preferably at least 25. The electric resistance stayed constant at a value of slightly lower than 20Ω when the number of pillar sections 33 per connection pad 211 was increased to 50 or more. The result indicates that the electric resistance shows little change even if the number of pillar sections 33 per connection pad 211 is increased to 50 or more. Accordingly, the electric resistance through the pillar sections 33 is stable as long as the number of pillar sections 33 per connection pad 211 is at least 50.

Figure 11:
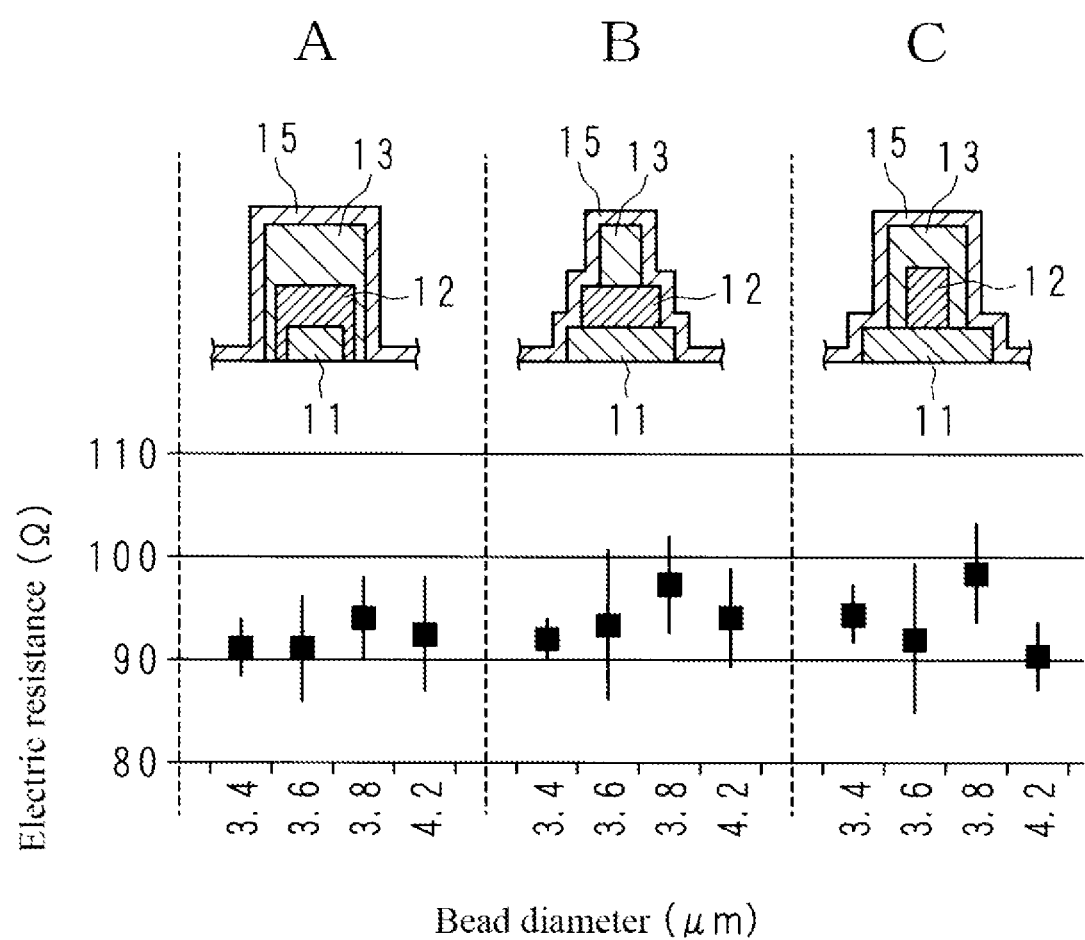
FIG. 11 is a chart illustrating a relationship between electric resistance and structure of the pillar sections.

The present embodiment has been described using an example in which the upper coloring films in the base 331 of each pillar section 33 entirely cover the lower coloring films. However, the bases 331 of the pillar sections 33 are not limited to the example and may have a different structure. FIG. 11 is a chart illustrating a relationship between electric resistance and structure of the pillar sections 33. In FIG. 11, the horizontal axis represents diameter of the insulating beads contained in the sealing section 31, and the vertical axis represents electric resistance between the electrode layer 15 and the circuit layer 21 obtained through the pillar sections 33. FIG. 11 shows a result of electric resistance obtained through the pillar sections 33 having different structures A, B, and C. As in the example illustrated in FIG. 6, the pillar sections 33 having the structure A illustrated in FIG. 11 each include the base 331 in which the upper second coloring film 12 entirely covers the lower first coloring film 11, and the further upper third coloring film 13 entirely covers the second coloring film 12. The pillar sections 33 having the structure B illustrated in FIG. 11 each include the base 331 in which the upper second coloring film 12 partially covers the lower first coloring film 11, and the further upper third coloring film 13 partially covers the second coloring film 12. The pillar sections 33 having the structure C illustrated in FIG. 11 each include the base 331 in which the upper second coloring film 12 and the further upper third coloring film 13 partially cover the lower first coloring film 11, and the third coloring film 13 entirely covers the second coloring film 12.

FIG. 11 shows a result of electric resistance between the electrode layer 15 and the circuit layer 21 obtained through the pillar sections 33 having the structures A, B, and C when the diameter of the insulating beads contained in the sealing section 31 was 3.4 μm, 3.6 μm, 3.8 μm, and 4.2 μm. As shown in FIG. 11, the pillar sections 33 having the structure A resulted in electric resistance variations in a narrow range compared to the pillar sections 33 having the different structures. It is therefore desirable that the upper coloring films entirely cover the lower coloring films in the base 331 of each pillar section 33 in order to achieve stable electric resistance between the electrode layer 15 and the circuit layer 21. Note that it is possible to obtain the display panel 4 even with the use of the pillar sections 33 having a different structure, such as the pillar sections 33 having the structure B or C illustrated in FIG. 11, although such a display panel 4 is slightly less stable in terms of electric resistance.

The present embodiment has been described using an example in which the active matrix circuit is formed on the surface of the second substrate 2. However, the display panel 4 may have a configuration in which the active matrix circuit is formed on the surface of the first substrate 1. The drawings are to schematically illustrate the configuration of the display panel 4. That is, the display panel 4 may include elements that are not shown in the drawings. The present embodiment has been described mainly using an example in which the pillar sections 33 and the sealing section 31 are formed on the first substrate 1. However, either or both of the pillar sections 33 and the sealing section 31 may be formed on the second substrate 2.

A display panel according to an embodiment of the present disclosure includes a first substrate, a second substrate, a sealing section, and a plurality of pillar sections. The first substrate has a surface provided with an electrode layer. The second substrate has a surface provided with line routing for applying signals to the electrode layer. The surface of the second substrate faces the surface of the first substrate. The sealing section defines a sealed space between the opposing surfaces of the first and second substrates. The pillar sections enable electrical connection between the electrode layer and the line routing. The pillar sections are located in contact with the sealing section.

In the display panel according to the present embodiment, preferably, the first substrate and the second substrate are bonded together through the sealing section. Preferably, the pillar sections are formed at positions that allow the pillar sections to be out of contact with the sealing section before the first substrate and the second substrate are bonded together through the sealing section and that allow the pillar sections to be in contact with the sealing section after the first substrate and the second substrate have been bonded together through the sealing section.

In the display panel according to the present embodiment, preferably, the pillar sections are not in contact with a specific middle line between an inner edge and an outer edge of a contact region of the surface of the first substrate. The contact region is a region where the first substrate and the sealing section are in contact with each other.

In the display panel according to the present embodiment, preferably, the surface of the first substrate is provided with a plurality of coloring films. Preferably, each of the pillar sections includes a base and the electrode layer covering the base. The base includes the plurality of coloring films stacked on one another on the surface of the first substrate at a position that allows the pillar section to be in contact with the sealing section.

In the display panel according to the present embodiment, preferably, every upper coloring film entirely covers every lower coloring film among the plurality of coloring films in the base of each pillar section.

A display apparatus according to an embodiment of the present disclosure includes the display panel according to the embodiment of the present invention.

A display panel production method according to an embodiment of the present disclosure is a method for producing a display panel including a first substrate, a second substrate, a sealing section, and a plurality of pillar sections. The first substrate has a surface provided with an electrode layer. The second substrate has a surface provided with line routing for applying signals to the electrode layer. The surface of the second substrate faces the surface of the first substrate. The sealing section defines a sealed space between the opposing surfaces of the first and second substrates. The pillar sections enable electrical connection between the electrode layer and the line routing. The method includes: forming the pillar sections on the surface of the first substrate and then forming the sealing section on the surface of the first substrate at a position where the sealing section is not in contact with the pillar sections; causing the surface of the first substrate and the surface of the second substrate to face each other; and bonding the first substrate and the second substrate together through the sealing section to electrically connect the pillar sections to the line routing on the second substrate. The position at which the sealing section is formed allows the sealing section spreading due to the first and second substrates being bonded together through the sealing section to be in contact with the pillar sections.

According to the present embodiment, the display panel used for the display apparatus includes the first substrate, the second substrate, the sealing section, and the pillar sections. The first substrate has a surface provided with an electrode layer. The second substrate has a surface provided with line routing for applying signals to the electrode layer. The surface of the second substrate faces the surface of the first substrate. The sealing section defines a sealed space between the opposing surfaces of the first and second substrates. The pillar sections enable electrical connection between the electrode layer and the line routing. The pillar sections are located in contact with the sealing section. The pillar sections enable conduction between the electrode layer and the line routing without the need to include conductive beads in the scaling section. Since the sealing section contains no conductive beads, the possibility of undesired conduction between the electrode layer and the line routing is eliminated even in the case of a display panel in which the contact section is exposed on the surface of the first substrate or the surface of the second substrate. Since the pillar sections are located in contact with the sealing section, it is not necessary to secure a space for the pillar sections outside of the sealing section.

According to the present embodiment, the display panel is produced by forming the sealing section on the surface of the first substrate that has the pillar sections formed thereon, causing the surface of the first substrate and the surface of the second substrate to face each other, and bonding the first substrate and the second substrate together through the sealing section. The sealing section is formed at a position that allows the sealing section to be out of contact with the pillar sections before the first substrate and the second substrate are bonded together and that allows the sealing section spreading due to the first and second substrates being bonded together to be in contact with the pillar sections. As a result of the sealing section being formed as described above, the pillar sections are in positions that allow the pillar sections to be out of contact with the sealing section before the first substrate and the second substrate are bonded together through the sealing section and that allow the pillar sections to be in contact with the sealing section spreading due to the first and second substrates being bonded together through the sealing section. Since the position at which the sealing section is formed allows the sealing section to be out of contact with the pillar sections, the pillar sections are not covered by the sealing section when the sealing section is formed. The pillar sections therefore come in contact with the second substrate when the first substrate and the second substrate are bonded together through the sealing section. As a result, the pillar sections reliably enable connection between the electrode layer and the line routing.

According to the present embodiment, the pillar sections are not in contact with the specific middle line between the inner edge and the outer edge of the contact region of the surface of the first substrate with the sealing section. The specific middle line corresponds to the position on the surface of the first substrate at which the sealing section is formed. That is, the pillar sections are not covered by the sealing section when the sealing section is formed, ensuring that the pillar sections come in contact with the second substrate. Thus, the pillar sections reliably enable connection between the electrode layer and the line routing.

According to the present embodiment, a plurality of coloring films such as color filters are formed on the surface of the first substrate. Each of the pillar sections includes the base and the electrode layer covering the base, and the base includes the plurality of coloring films stacked on one another. The pillar sections can therefore be formed through the processes of forming the coloring films and the electrode layer. That is, formation of the pillar sections does not require any further process in addition to the processes of forming the coloring films and the electrode layer. Furthermore, formation of the pillar sections does not require any particular material for the pillar sections.

According to the present embodiment, each pillar section has a structure in which the upper coloring films completely cover the lower coloring films in the base. The pillar sections having such a structure result in variations of electric resistance between the electrode layer and the line routing in a narrow range compared to pillar sections having a structure in which the upper coloring films do not completely cover the lower coloring films in the base. Thus, the pillar sections enable stable conduction between the electrode layer and the line routing.

REFERENCE SIGNS LIST

1 First substrate
10 Display apparatus
11 First coloring film
12 Second coloring film
13 Third coloring film
15 Electrode layer
2 Second substrate
21 Circuit layer (line routing)
211 Connection pad (line routing)
31 Sealing section
311 Inner edge
312 Outer edge 32 Liquid crystal
33 Pillar section
331 Base
4 Display panel

The invention claimed is:
1. A display panel comprising:
a first substrate having a surface provided with an electrode layer;
a second substrate having a surface provided with line routing for applying signals to the electrode layer, the surface of the second substrate facing the surface of the first substrate;
a sealing section defining a sealed space between the opposing surfaces of the first and second substrates; and
a plurality of pillar sections enabling electrical connection between the electrode layer and the line routing, wherein
the pillar sections are located in contact with the sealing section,
the surface of the first substrate is provided with a plurality of coloring films,
each of the pillar sections includes a base and the electrode layer covering the base, the base including the plurality of coloring films stacked on one another on the surface of the first substrate at a position that allows the pillar section to be in contact with the sealing section,
in the base, each of the plurality of coloring films is in contact with the surface of the first substrate,
every upper coloring film entirely covers every lower coloring film among the plurality of coloring films in the base of each pillar section, and
in the base, the electrode layer covering the base is in contact with only an uppermost coloring film among the plurality of coloring films.
2. The display panel according to claim 1, wherein
the first substrate and the second substrate are bonded together through the sealing section, and
the pillar sections are located at positions that allow the pillar sections to be out of contact with the sealing section before the first substrate and the second substrate are bonded together through the sealing section and that allow the pillar sections to be in contact with the sealing section after the first substrate and the second substrate have been bonded together through the sealing section.
3. The display panel according to claim 1, wherein
the pillar sections are not in contact with a specific middle line between an inner edge and an outer edge of a contact region of the surface of the first substrate, the contact region being a region where the first substrate and the sealing section are in contact with each other.
4. A display apparatus comprising the display panel according to claim 1.
5. A method for producing a display panel,
the display panel including
a first substrate having a surface provided with an electrode layer,
a second substrate having a surface provided with line routing for applying signals to the electrode layer, the surface of the second substrate facing the surface of the first substrate,
a sealing section defining a sealed space between the opposing surfaces of the first and second substrates, and
a plurality of pillar sections enabling electrical connection between the electrode layer and the line routing,
the method comprising:
providing a plurality of coloring films one by one on the surface of the first substrate to obtain a base including the plurality of coloring films stacked on one another,
forming the pillar sections on the surface of the first substrate and then forming the sealing section on the surface of the first substrate at a position where the sealing section is not in contact with the pillar sections;
causing the surface of the first substrate and the surface of the second substrate to face each other; and
bonding the first substrate and the second substrate together through the sealing section to electrically connect the pillar sections to the line routing on the second substrate, wherein
the position at which the sealing section is formed allows the sealing section spreading due to the first and second substrates being bonded together through the sealing section to be in contact with the pillar sections,
each of the pillar sections includes the base and the electrode layer covering the base, the base including the plurality of coloring films stacked on one another on the surface of the first substrate at a position that allows the pillar section to be in contact with the sealing section, and
in the base, each of the plurality of coloring films is in contact with the surface of the first substrate, and among the plurality of coloring films, a first coloring film is entirely covered by a second coloring film provided immediately after the first coloring film.
6. The method according to claim 5, further comprising:
providing the electrode layer on the first substrate to entirely cover the base.
7. The method according to claim 6, in the base, the electrode layer covering the base is in contact with only a coloring film provided last among the plurality of coloring films.
8. A method for producing a display panel,
the display panel including
a first substrate having a surface provided with an electrode layer,
a second substrate having a surface provided with line routing for applying signals to the electrode layer, the surface of the second substrate facing the surface of the first substrate,
a sealing section defining a sealed space between the opposing surfaces of the first and second substrates, and
a plurality of pillar sections enabling electrical connection between the electrode layer and the line routing,
the method comprising:
providing a plurality of coloring films one by one on the surface of the first substrate to obtain a base including the plurality of coloring films stacked on one another,
providing the electrode layer on the first substrate to entirely cover the base,
forming the pillar sections on the surface of the first substrate and then forming the sealing section on the surface of the first substrate at a position where the sealing section is not in contact with the pillar sections;
causing the surface of the first substrate and the surface of the second substrate to face each other; and
bonding the first substrate and the second substrate together through the sealing section to electrically connect the pillar sections to the line routing on the second substrate, wherein the position at which the sealing section is formed allows the sealing section spreading due to the first and second substrates being bonded together through the sealing section to be in contact with the pillar sections, each of the pillar sections includes the base and the electrode layer covering the base, the base including the plurality of coloring films stacked on one another on the surface of the first substrate at a position that allows the pillar section to be in contact with the sealing section, and in the base, each of the plurality of coloring films is in contact with the surface of the first substrate and the electrode layer covering the base is in contact with only a coloring film provided last among the plurality of coloring films.

* * * * *